United States Patent
Hasegawa et al.

(10) Patent No.: US 6,266,130 B1
(45) Date of Patent: Jul. 24, 2001

(54) POSITION DETECTING METHOD AND POSITION DETECTING SYSTEM

(75) Inventors: Masanobu Hasegawa, Utsunomiya; Hideki Ina, Yokohama, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/231,795

(22) Filed: Jan. 15, 1999

(30) Foreign Application Priority Data

Jan. 16, 1998 (JP) .................................... 10-020444
Sep. 2, 1998 (JP) .................................... 10-263947

(51) Int. Cl.$^7$ ............... G03B 27/42; A61N 5/00; G21K 5/10; G01B 11/00
(52) U.S. Cl. .............. 355/53; 250/492.2; 250/492.22; 356/399; 356/400; 356/401
(58) Field of Search ................. 355/52, 53, 53.2, 355/53.22, 53.24, 53.26, 53.5, 67; 356/399, 400, 401; 438/14, 16, 975; 250/492.2, 492.22

(56) References Cited

U.S. PATENT DOCUMENTS 4,744,658 * 5/1988 Holly ........................ 356/351
4,901,109 2/1990 Mitome et al. ................. 355/68
5,309,197 5/1994 Mori et al. .................... 355/53
5,313,272 5/1994 Nose et al. .................... 356/375
5,793,473 * 8/1998 Koyama et al. ................ 355/55

FOREIGN PATENT DOCUMENTS 1-112726   5/1989   (JP) .

OTHER PUBLICATIONS

Kose, et al., Optical Engineering Handbook, Asakura Shoten, pp. 387–396 and 687–691.

* cited by examiner

Primary Examiner—Russell Adams
Assistant Examiner—Rodney Fuller
(74) Attorney, Agent, or Firm—Fitzpatrick, Cella, Harper & Scinto

(57) ABSTRACT

A position detecting system and method, wherein a wavefront that provides an optical path length distribution opposite to an optical pat length distribution to be defined in accordance with a shape of a light transmissive film on a mark provided on an object to be inspected, is produced, wherein the mark is illuminated with the produced wavefront, and an image of the illuminated mark is taken, such that positional information related to the mark is produced in response to the image taking.

25 Claims, 8 Drawing Sheets

POSITION DETECTING METHOD AND POSITION DETECTING SYSTEM

FIELD OF THE INVENTION AND RELATED ART

This invention relates to a position detecting method and a position detecting system for optically measuring, at a high precision, the position of an object to be detected and for aligning the object with respect to a predetermined position. For example, the invention is suitably usable in a semiconductor device manufacturing projection exposure apparatus, called a stepper, for sequentially projecting and printing an image of a circuit pattern formed on the surface of a reticle onto pattern regions upon a wafer through a projection lens system, to produce semiconductor devices.

In a projection exposure apparatus called a stepper, for the manufacture of semiconductor devices, a reduction projection optical system is used to sequentially project an image of a circuit pattern formed on a reticle onto pattern regions upon a wafer in a reduced scale, by which the circuit pattern is transferred to these regions. During This pattern transfer process, in the stepper, each pattern region on the wafer is brought into accurate alignment with respect to the reticle and, thereafter, the projection exposure operation is performed.

A wafer has plural registration or alignment marks formed thereon for the registration. The stepper is provided with an alignment microscope for detecting alignment marks so as to obtain positional information related to pattern regions on the wafer. On the basis of the positional information about the alignment marks thus obtained through the alignment microscope, the position of the wafer with respect to the reticle is precisely detected in the stepper, and thus, each pattern region of the wafer can be accurately brought into alignment with the reticle.

As regards an alignment method based on such an alignment microscope, there are a TTL alignment method (TTL system) and an off-axis alignment method. In the TTL alignment method, observation is made through a reduction projection optical system and, therefore, it is called a TTL (Through The Lens) system. The alignment microscope serves to observe alignment marks on the after surface by use of illumination light having a wavelength different from exposure light and with respect to which wavelength a resist applied to the wafer is non-sensitive. On the basis of the result of observation, the wafer alignment is performed.

On the other hand, the off-axis alignment method is a detecting method without the use of a projection optical system. Positional information is detected by use of a microscope (off-axis microscope) which is disposed at a position separate from the wafer exposure position. Then, the wafer is moved to the exposure position, whereby wafer alignment is performed.

The TTL method and the off-axis method have both advantages and disadvantages.

In the TTL method, since the alignment information is detected through a projection lens, the distance (called "base line") between the exposure position and the position for alignment observation is short. This is advantageous in with respect to a change with time of the base line. In the off-axis method, on the other hand, although there is a disadvantage that the base line is long, since the projection lens does not intervene, there is a small limitation condition to the optical detection system and, generally, it assures higher precision detection as compared with the TTL detection system. In the TTL method, a projection lens which is aberration corrected with respect to the exposure wavelength has to intervene, and it is difficult to design the wavelength of an alignment microscope as broad band because it differs from the exposure wavelength.

As is well known in the art, an alignment observation system using monochromatic light generally has a large process dependency, as compared with an alignment observation system using broad band illumination. Further, as the exposure linewidth is becoming smaller and smaller and in cases where an excimer laser is used as an exposure light source, the difference between the exposure wavelength (248 nm) and the alignment wavelength (e.g., 633 nm of a He—Ne laser wavelength) becomes very large as compared with cases where conventional i-line is used. This results in the production of large chromatic aberration of a projection lens, with respect to the alignment wavelength. Alternatively, provision of a coating film having a high transmissivity both to the exposure wavelength and the alignment wavelength is difficult to achieve. For these reasons, practically, it is very difficult to design an image detection TTL system.

For the reasons described above, improvements of precision with the off-axis alignment method have become more and more important, with further miniaturization of patterns.

FIG. 1A is a schematic view of a conventional semiconductor exposure apparatus with an off-axis alignment detection system. Since the operation and function of such a semiconductor exposure apparatus are well known in the art, a detailed description will be omitted here. The off-axis alignment detection system 1 is disposed adjacent to a reduction projection lines 2, and it serves to detect positions of alignment marks provided on scribe lines (not shown) upon a wafer 3. Denoted at 51 is a mask, and denoted at 52 is a CPU. Denoted at 53 is an illumination system and at 54 is a stage system.

Although, generally, the off-axis method has a smaller process dependency as compared with the TTL method, when total overlay budget is taken into account, the proportion occupied by the process precision is still large. One major factor is a lens effect of a resist covering an alignment mark.

FIG. 1B is a schematic view for explaining the lens effect of a resist. The upper half illustrates reflected light rays from a mark, and the lower half illustrates an output of a CCD which receives the light rays. While the target of an alignment mark is formed with a predetermined step height (level difference), it is made symmetrically or asymmetrically due to the process or processes. Furthermore, usually in the sectional shape, a resist covers it asymmetrically. A portion of light (A–D) projected on the resist surface is refracted by the inclined resist surface and then is reflected by the surface of a bottom substrate at a predetermined angle. Then, it goes out of the resist surface (A'–D'). At this moment, the light is influenced again by refraction. Due to the double refraction effect, the paths of light rays emitted from left-hand and right-hand edges of the mark are modulated asymmetrically, causing a large factor of process error.

SUMMARY OF THE INVENTION

It is an object of the present invention to provide a position detecting method and/or a position detecting system by which a refraction effect at the surface of a resist during observation is removed or reduced, by which a process error attributable to asymmetry of a resist or an alignment pattern is reduced, and by which high precision alignment is assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
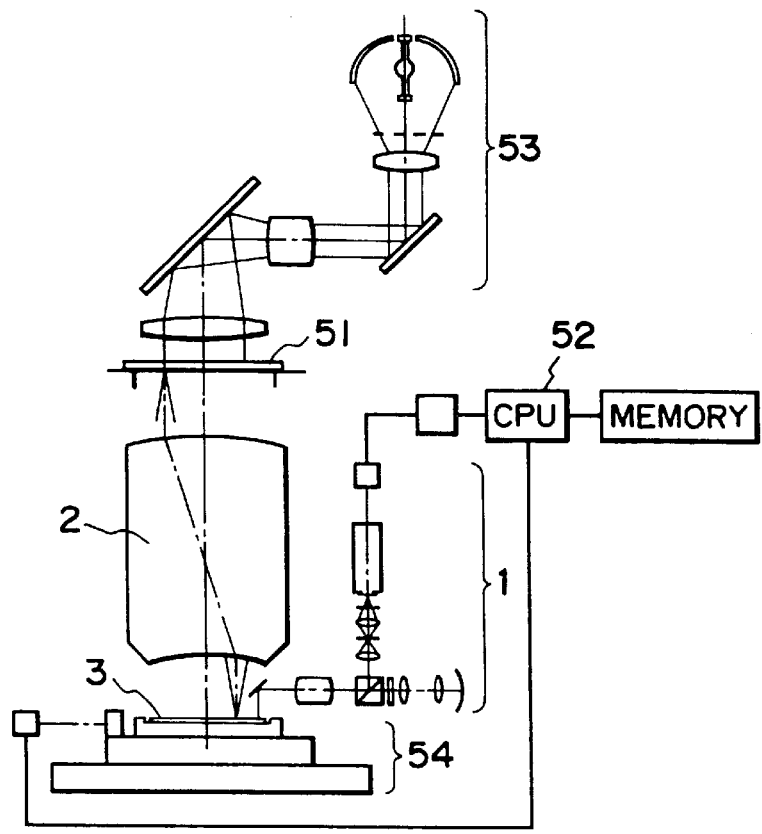
FIG. 1A is a schematic view of a main portion of a conventional projection exposure apparatus.
Figure 1B:
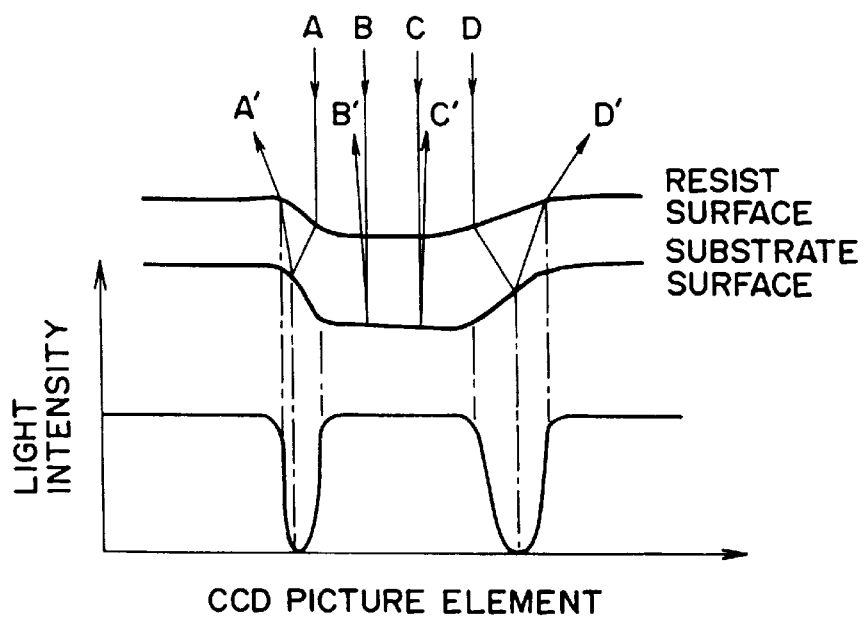
FIG. 1B is a schematic view for explaining a resist refraction effect.

FIGS. 2A–5 are illustrations for explaining the basic concept of a position detecting system according to the present invention as well as a first embodiment of the present invention. The position detecting system according to the present invention can be applied to the detection system 1 of the projection exposure apparatus shown in FIG. 1A.

A primary object of the first embodiment of the present invention is to reduce a refraction effect at the resist interface and to reduce a process error included in the alignment precision, to thereby improve the alignment precision. To this end, in the embodiment, a mark (alignment mark) is illuminated with such a wavefront as providing a plane wave after being incident upon a resist, thereby to cancel the refraction effect of the resist. Such illumination may be accomplished by, for example, illuminating an alignment mark obliquely, by subsequently directing its reflected wavefront to adjust lateral magnification appropriately, and by illuminating again the alignment mark with it perpendicularly.

Figure 2A:
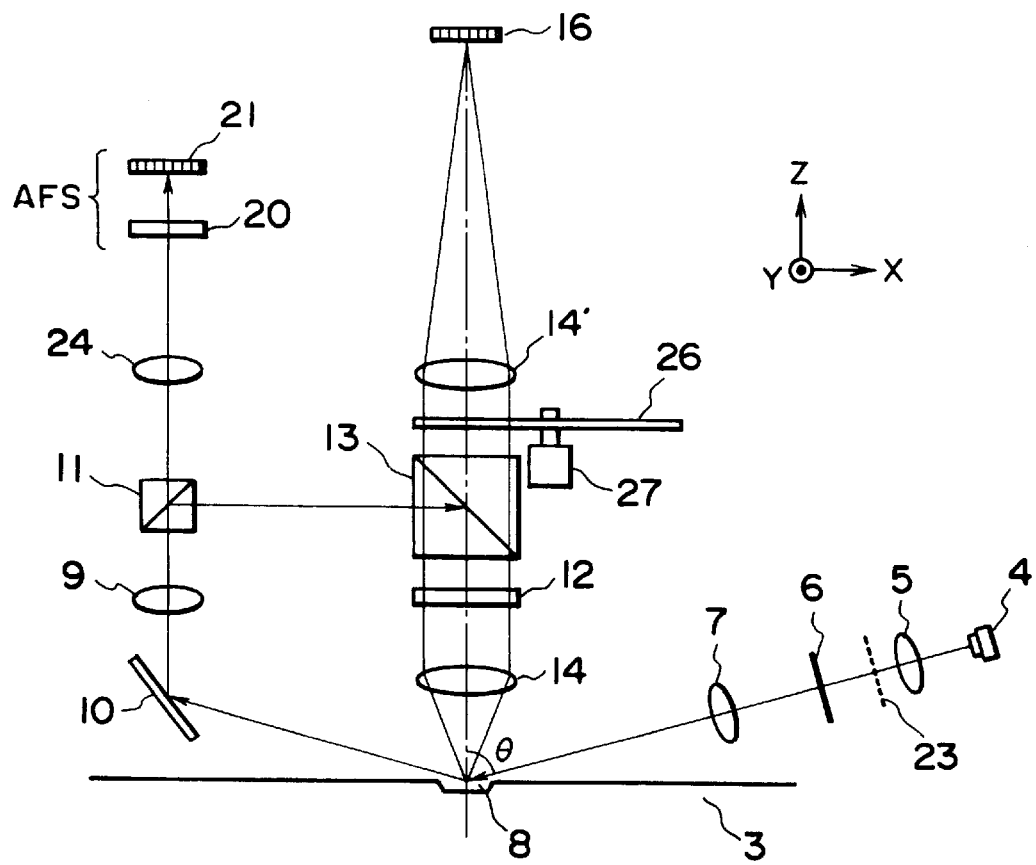
FIG. 2A is a schematic view of a main portion of a first embodiment of the present invention.
Figure 2B:
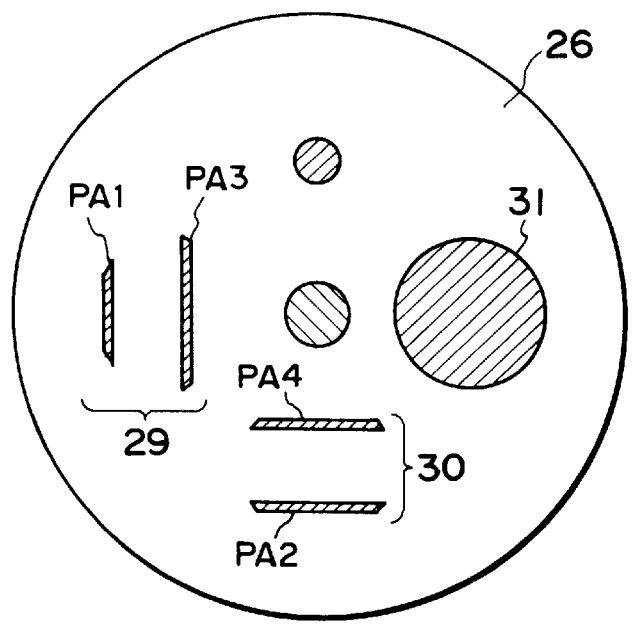
FIG. 2B is a schematic view for explaining a pupil filter plate.

Details of the first embodiment will be described with reference to FIG. 2A. FIG. 2A shows the basic structure of a position detecting system according to the present invention. Light from a light source 4 which comprises a He—Ne laser or a semiconductor laser, is projected through a collimator lens 5, a slit plate 6 and a lens 7 to illuminate an alignment mark (mark) 8 on a wafer 3, obliquely with a predetermined angle θ. The slit 6 included in the illumination optical system is used for alignment of the illumination light and the alignment mark 8. The function of it will be described later.

The wavefront as reflected by the surface of a resist upon the mark 8 is directed through a mirror 10, a lens 9, a half mirror 11, and a PBS (polarization beam splitter) 13, such that it illuminates the same mark 8 from above and through a quarter waveplate 12 and a lens 14. A bight-field image as reflected by the mark 8 goes back along its oncoming path and, after passing through the beam splitter 13 and a lens 14', it can be observed through a two-dimensional sensor 16 such as a CCD camera, for example. In place of the two-dimensional sensor, the photoelectric detection system may comprise a structure wherein light is contracted in a one-dimensional direction by use of a cylindrical lens, for example, and is received by a one-dimensional sensor.

In this embodiment, the reflected wavefront from the alignment mark 8 is expanded four times in lateral magnification by means of the lenses 9 and 14, and then it is projected again on the alignment mark 8. Adjustment of longitudinal and lateral magnifications at this second projection (re-incidence) will be explained in detail with reference to FIG. 4.

Figures 3, 4:
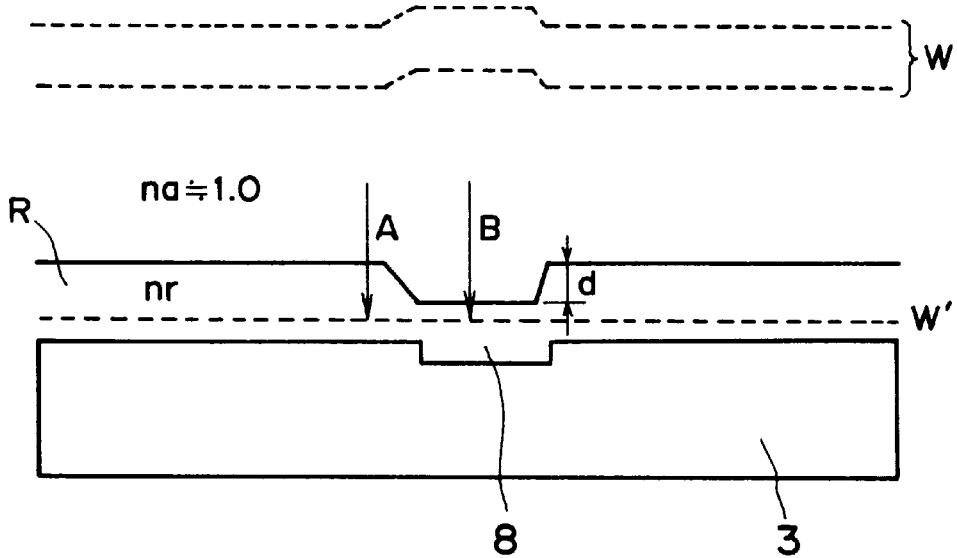
FIG. 3 is a schematic view for explaining an illumination slit and a positioning mark.
FIG. 4 is a schematic view for explaining the principle of reducing the refraction effect.

FIG. 4 illustrates the section of the wafer alignment mark 8 as coated with a resist R, and the wavefronts W and W' of light projected thereupon. Referring to FIG. 4, a condition for an optical path difference between the surface step portion B and its peripheral portion A, for accomplishing that the wavefront W is transformed into a plane wave W' after being incident upon the resist, will be considered. The optical path difference Δ applied to the transmissive light is given by the product of the surface level difference d at the resist surface and the refractive index difference (nr−1) between the resist and the air. Thus, it is given by Δ=(nr−1)d. Since the refractive index nr of the resist R material is about 1.5, Δ≈0.5 d. Therefore, when the illumination is so made that the longitudinal magnification (magnification along the optical axis direction) of a reflected wavefront to the surface level difference d becomes about 0.5, the condition for flattening the transmitted wave after passing the resist surface can be satisfied.

If the angle of initial incidence of illumination light upon the wafer 3 is θ as shown in FIG. 2A, due to the oblique incidence effect, the converted value of longitudinal magnification of the reflected wavefront becomes equal to 2 cos θ. If the incidence angle is 75.5 deg., the 2 cos θ=0.50. Thus, a longitudinal magnification of almost as desired is obtained. On the other hand, the converted value of lateral magnification of a reflected wavefront is given by cos θ. If the incidence angle is 75.5 deg., cos θ=0.25. When a lens system of 4× is inserted to direct the reflected illumination light to illuminate the alignment mark perpendicularly, the total lateral magnification becomes equal to 1. Thus, it is seen that illumination with desired longitudinal and lateral magnifications can be accomplished.

While the foregoing description has been made of an example wherein the refractive index nr of the resist material with respect to the alignment wavelength is 1.5, since the amount of correction described above is very small, even through nr or θ deviates from the described relation slightly (±20%), a similar advantageous effect is attainable. For example, when the light source 4 comprises an LD and provides light having a bandwidth of 5–10 nm and if it is incident with a predetermined angle with respect to the center wavelength, the above-described relation is not accomplished with respect to any other wavelength. However, the error resulting from failure of accomplishment of the relation will be within a tolerable range.

Next, the manner of positioning reflection illumination light with respect to an alignment mark will be explained.

Referring back to FIG. 2A, the illumination light emitted from the light source 4 is transformed by the collimator lens 5 into a flat wave, and it illuminates the slit plate 6 from the back thereof (from the light source side). The slit plate 6 has a structure with interchangeable slits 41 and 43, as shown in FIG. 3. Here, the view field of the two-dimensional CCD 16 has a shape such as depicted by a broken-line area 44, and the slit 41 comprises a rectangular transmission window being sufficiently small as compared with the view field 44, while the slit 43 comprises a window for transmitting the light within the whole view field.

Upon a reference mark table disposed adjacent to a wafer chuck, there is a mark 42. The mark 42 comprises a diffraction grating having a particular pitch in the alignment direction. In the drawing, the x direction is the alignment direction.

For adjustment of the relative position of the projected beam and the alignment mark, the pair of the slit 41 and mark 42 is used. An image of the slit 41 is projected during the wafer projection so that it is included in the mark 42. The positioning tolerance at the wafer projection is L1:L3=L2:L4, this being for the same level in the X and Y directions. For example, L1:L3=0.5:1. Also, L2 is the length after projection and, at the slit position, L2'=L2×cos θ. At the wafer alignment operation, the slit 41 is changed by the slit 43, and the whole wafer mark 8 surface is irradiated with a plane wave. Here, as regards the size of the slit 43, it is arranged so that a sufficiently large size is maintained with respect to the alignment view field 44 during the wafer projection. The width L5 of the slit 43 in the alignment direction (X direction) is, at the slit position, L5'=L5×cos θ.

Figure 5:
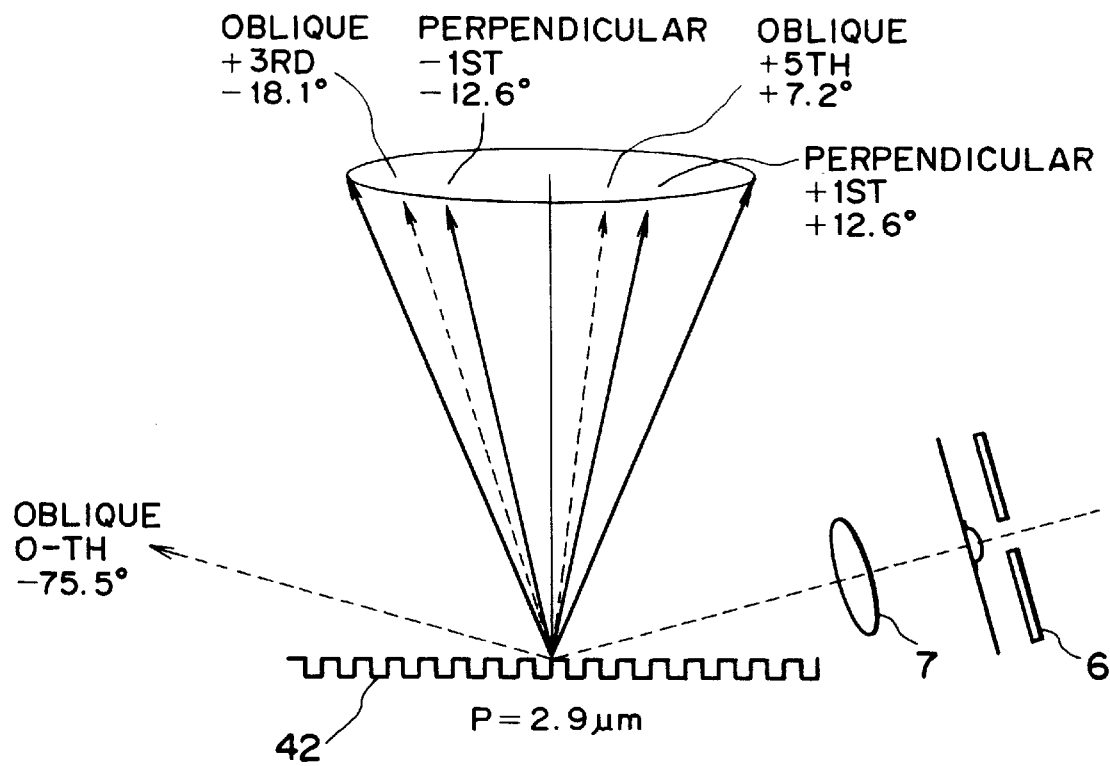
FIG. 5 is a schematic view for explaining the principle of illumination light alignment.

The position on the alignment mark where the oblique illumination light illuminates can be determined by using third-order and fifth-order diffractive light, as the grating image as formed by the slit 41 is diffracted by the mark 42. As shown in FIG. 5, if the mark pitch is 2.9 microns, the illumination wavelength is 633 nm, and the incidence angle of illumination light is 75.5 deg., the diffractive light described above is produced at angles of −18.1 deg. and +7.2 deg. from the perpendicular direction. Since an objective lens with a numerical aperture (NA) 0.4 has an acceptance angle of ±23.6 deg., it can detect these diffractive light rays and, thus, an image 41' of the slit 41 can be defined upon the CCD 16. In FIG. 2A, for separate detection of the image 41', a pupil filter plate 26 is disposed adjacent to the pupil position and, by using pupil filter means 29 shown in FIG. 2B, these diffractive light rays are detected selectively.

The wavefront as reflected by the mark 8 is directed by mirror 10, half mirror 11 and polarization beam splitter 13, and again it illuminates the mark 8 perpendicularly. Also, for the relative positioning of this second-illumination light and the mark 42, diffractive light is used. When a grating having a pitch of 2.9 micron as described hereinbefore is illuminated perpendicularly, positive and negative first-order diffractive lights are produced with angles ±12.6 deg. Since, as described, the objective lens 14 of NA 0.4 has an acceptance angle of ±23.6 deg., it can detect diffractive light of ±12.6 deg. Therefore, by use of pupil filter means 30, an image 41" of the slit 41 upon the CCD 16 can be separately detected. Changing pupil filters is accomplished through actuation of a motor 27. Upon the CCD 16, through interchanging the filters 29 and 30, the relative position of the image 41' of the slit 41, being diffracted by oblique incidence, and the image 41" of the slit 41 formed by perpendicular incidence, can be detected. Subsequently, focus adjustment of wafer 3 is performed so that the images 41' and 41" are registered with each other with respect to the X direction (alignment direction), by which the beam positioning with respect to the alignment direction is accomplished. Further, by adjusting a tilt mechanism (not shown) for the mirror 10 so that the images 41' and 41" of the slit 41 are registered with each other with respect to the Y direction, which is perpendicular to the alignment direction, the beam positioning with respect to the Y direction can be accomplished. The focus reference at this moment is memorized with a focus sensor 21. After this, the wafer 3 is set so that it is registered with the above-described focus reference, and the alignment mark is set within a desired view field. Then, the mark can be illuminated again with the reflected wavefront from the mark itself. These operations may be made during initial adjustment of the system. Thus, there is no loss of throughput during the exposure operation.

As shown in FIG. 2A, the position detecting system is provided with a focus detection system AFS, in addition to the structure described above, for detecting the focus position of the mark 8. The positions illuminated with the oblique incidence light and the perpendicular illumination light relatively shift by tan θ×ΔZ laterally when the height of the mark 8 changes by ΔZ. With the incidence angle 75.5 deg. As described, for a displacement ΔZ=1 micron, the point of irradiation shifts by 3.9 microns. Thus, for enhanced positioning precision of the irradiation point, accurate focusing is necessary. The principle of focus detection in FIG. 2A is based on a slit light oblique projection method which is known in the art. It is disclosed in Japanese Laid-Open Patent Application, Laid-Open No. 112726/1989, for example. As regards the irradiation slit, the slit 41 for illumination light positioning can be used, and the focus detection can be done in common with the position detection of this embodiment. The image of the slit 41 once imaged upon the mark 8 is enlarged at a predetermined magnification by lenses 9 and 24 and, after this, it is compressed by a cylindrical lens 20 in a one-dimensional direction and is re-imaged upon a one-dimensional CCD 21 as a light spot. When the position of the wafer 3 displaces upwardly or downwardly, the position of the light spot upon the sensor 21 shifts rightwardly or leftwardly. Based on this shift, the position of the light spot on the sensor 21 is detected. Then, through actuation by use of a driving system (not shown), the height or level of the wafer 3 can be positioned with a 0.1 micron order. As described hereinbefore, since positioning of the second-illumination light and the alignment mark can be done by adjusting the wafer at a predetermined level during an initial adjustment operation, only focus detection with the focus detection system AFS may well be performed in the alignment operation during the exposure sequence.

In this embodiment, as described above, oblique incidence light is projected to a mark itself which is the subject of detection, by which information is produced. Thereafter, the light bearing the information is turned back to the mark, for illumination thereof. In the light having its position of re-illumination best adjusted, the effect of the resist surface is canceled and, as shown in FIG. 4, a plane wave having a uniform wavefront is provided, after passing the resist surface. When the mark detection is performed by use of such a wavefront, detection can be made with the effect of a surface state of the resist being removed. Thus, the precision of alignment detection can be improved significantly.

Figure 6:
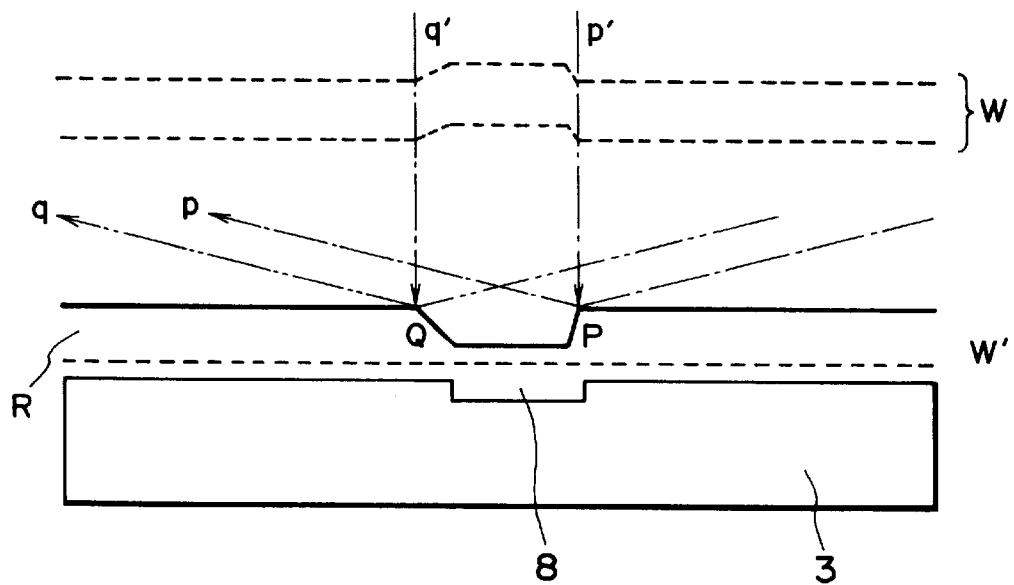
FIG. 6 is a schematic view for explaining reflection light upon the surface of a resist, according to the present invention.

In addition to the features described above, there is a condition for the number of mirrors and lenses for directing the illumination light. As shown in FIG. 6, light p reflected at point P on the resist surface should illuminate, after being directed, the same location as the reflection point P on the resist surface. Without this, wavefront compensation is not attainable. This applies to all light rays, for example, light rays q and q'. For directing a light ray, use of a mirror or lens is necessary. Such an optical element functions to reverse the wavefront in its advancement direction. Therefore, in order that the wavefront W is illuminated as an erected image, the total number of mirrors and lens systems should be an odd number. The reason for an odd number, not an even number, is that when the light is reflected at the resist surface, the image is reversed once. The lens system mentioned here refers to a unit of lens group that constitutes one imaging system.

Next, the state of polarization of incident light in this embodiment will be explained.

In a preferred structure according to the present embodiment, as regards the state of polarization of the oblique incidence light, the light is projected as S-polarized light for attaining an improved reflection factor at the resist surface. In this embodiment, a polarization plate 23 is inserted after the incidence side collimator 5. Also, for perpendicular illumination after the light direction, preferably, a circularly polarized light or non-polarized light may be used, to avoid the effect of polarization due to diffraction. To this end, in FIG. 2A, the light reflected by the polarization beam splitter PBS13 is transformed into circular polarization illumination by means of a quarter waveplate 12.

When the illumination is performed by non-polarized light, use of polarization plate 23 and quarter waveplate 12 is unnecessary. The beam splitter 13 may be replaced by a half mirror.

In a projection exposure apparatus according to the present invention, alignment of a reticle and a wafer may be performed by use of a position detecting system such as described above and, after that, a pattern of the reticle may be printed on the wafer surface by projection exposure.

Figure 7:
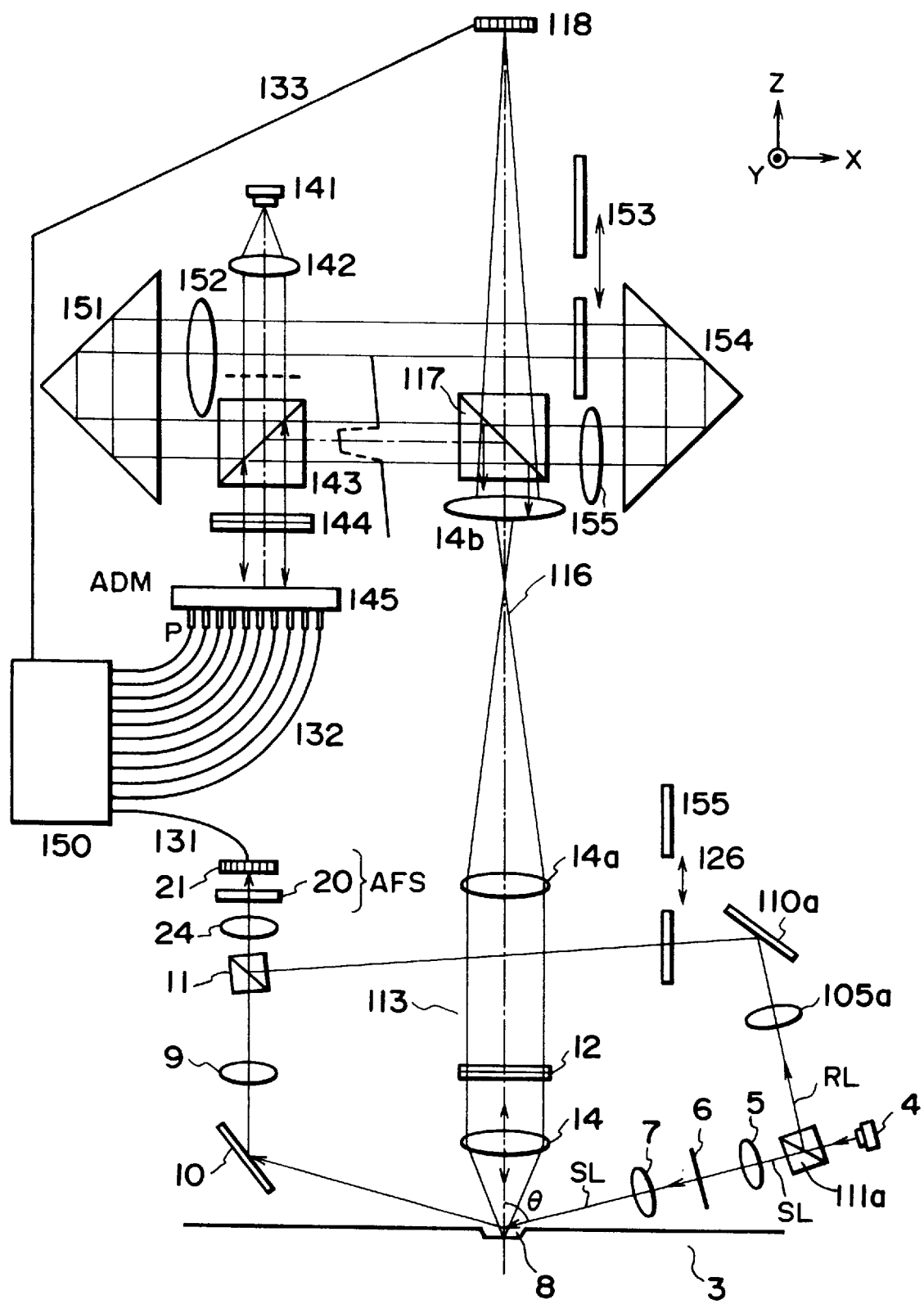
FIG. 7 is a schematic view of a main portion of a second embodiment of the present invention.

FIG. 7 is a schematic view for explaining the principle of a position detecting system according to a second embodiment of the present invention.

A primary object of the second embodiment of the present invention is to reduce the refraction effect at the resist interface, like the first embodiment, and to reduce a process error included in the alignment precision, to thereby improve the alignment precision. To this end, in this embodiment, a mark (alignment mark) is illuminated with such a wavefront as providing a plane wave after being incident upon a resist, thereby to cancel the refraction effect of the resist.

Such illumination may be accomplished by, for example, illuminating an alignment mark obliquely; by subsequently receiving the reflected wavefront; by detecting therefrom the information about the shape of a resist on the alignment mark; by energizing a number of piezoelectric devices disposed at the back of a mirror though different amounts in accordance with the detected information thereby to provide an adaptive mirror; by defining a wavefront of an optical path difference opposite to the wavefront of an optical path difference as produced by the resist shape; and then by illuminating again the alignment mark perpendicularly with the thus formed wavefront.

Details of the second embodiment will be described with reference to FIG. 7. FIG. 7 shows the basic structure of a position detecting system according to the second embodiment of the present invention. Light from a light source 4 which comprises a He—Ne laser or a semiconductor laser, passes a half mirror 111a and it is projected through a collimator lens 5, a slit plate 6 and a lens 7 to illuminate an alignment mark (mark) 8 on a wafer 3, obliquely with a predetermined angle θ, as measurement light SL. The slit 6 included in the illumination optical system is used for alignment of the illumination light and the alignment mark 8. The function of it will be described later.

The wavefront as reflected by the surface of a resist upon the mark 8 is directed through a mirror 10 and a lens 9, and it is projected on a half mirror 11.

On the other hand, of the light from the light source 4, light RL as reflected by the half mirror 111a goes via a lens 105a and a mirror 110a and it is projected on the half mirror 11. The light SL and the light RL are combined with each other by the half mirror 11. Then, the light is collected by a lens 24 and, after passing a cylindrical lens 20, an interference fringe is produced on a photoelectric converting element (sensor) 21 such as a CCD camera, for example. This interference fringe bears phase information including information related to the wavefront shape difference between the measurement light SL, having a wavefront that contains shape information related to the resist surface, and the reference light RL wherein the original wavefront is maintained. Thus, from this phase information, the shape information related to the resist surface is detected.

There may be various methods for detecting such phase information. A convenient example may be a method called a Fourier transform method. As regards the Fourier transform method, reference may be made to "Optical Engineering Handbook", by Kose, et al., Asakura Shoten, Japan, page 393, for example.

Next, details of the manner of forming a wavefront of an optical path difference opposite to the wavefront of an optical path difference as produced by the resist shape on the alighment mark 8, will be explained.

First, as regards the relation between the resist surface and the wavefront to be provided for illumination, what has described with reference to FIG. 4 applies similarly.

Namely, FIG. 4 illustrates the section of the wafer alignment mark 8 as coated with a resist R, and the wavefronts W and W' of light projected thereupon. Referring to FIG. 4, a condition for an optical path difference between the surface step portion B and its peripheral postion A, for accomplishing that the wavefront W is transformed into a plane wave W' after being incident upon the resist R material, will be considered. The optical path difference Δ applied to the transmissive light is given by the product of the surface level difference d at the resist surface and the refractive index difference (nr−1) between the resist and the air. Thus, it is given by Δ=(nr−1)d. Since the refractive index nr of the resist R material is about 1.5, Δ≈0.5d. Therefore, when the illumination is so made that the longitundinal magnification (magnification along the optical axis direction) of a reflected wavefront to the surface level difference d becomes about 0.5, the condition for flattening the transmitted wave after passing the resist surface can be satisfied.

While the described arrangement related to an example wherein the refractive index nr of the resist material with respect to the alignment wavelength is 1.5, even though it deviates from the described relation slightly (±20%), similar advantageous effect is attainable. For example, when the light source 4 comprises an LD and provides light having a bandwidth of 5–10 nm and if it is incident with a predetermined angle, the above-described relation is not accomplished with respect to every wavelength. However, the error resulting from failure of accomplishment of the relation will be within a tolerable range.

Referring to FIG. 7, the manner of providing illumination light having a desired phase will be explained.

Intensity information of an interference fringe, including the surface shape of the resist, as can be provided by the photoelectric converting element 21 is applied through a communication system 131 to a computer 150, and the information related to the actual surface shape of the resist is calculated in accordance with the Fourier transform method, for example.

The computer 150 then applies, to an adaptive mirror ADM and through a communication system 132, drive information for those of a number of piezoelectric devices P effective to produce a phase difference corresponding to the calculated resist surface shape. The structure for driving the adaptive mirror ADM may be arranged in various ways, as described in the aforementioned "Optical Engineering Handbook", page 687, for example.

The light emitted from an alignment illumination light source 141 having a He—Ne laser, for example, passes through a polarization beam splitter 143 and a quarter waveplate 144, and then it is reflected by the adaptive mirror ADM.

The drive amount for the piezoelectric devices P described above may be determined while taking into account this reflection, and it may be that a phase is applied at the surface of the adaptive mirror ADM by an amount corresponding to a half of the phase difference with the resist surface shape. On that occasion, illumination light of a desired wavefront with the phase doubled through the reflection (i.e., the phase difference at the resist surface shape), can be produced.

Here, the reflection surface 145 of the adaptive mirror ADM may be place in an optically conjugate relation with the wafer to be illuminated.

The light reflected by the adaptive mirror ADM again passes through the quarter waveplate 144, by which the polarization direction is changed to S-polarization. Subsequently, it is then reflected by the polarization beam splitter 143 and then is reflected by a polarization beam splitter 117 of the imaging system. An intermediate image 116 is formed by an erector 14$b$ and, after passing through a relay lens 14$a$, a quarter waveplate 12 and an objective lens 14, the light illuminates the alighment mark 8 upon the wafer 3.

The light for illumination thus illuminates the alignment mark 8 of the wafer 3 with a plane wave, without being influenced by the resist on the surface, as exactly intended in this embodiment of the present invention. The reflection light therefrom goes through the objective lens 14, the quarter waveplate 12, the relay lens 14$a$, and the erector 14$b$ in the opposite order to the illumination. Since the direction of polarization of the light is in S-polarization, it then passes through the polarization beam splitter 117, such that an image of the alignment mark 8 of the water 3 is formed on a CCD (sensor) 118, constituting a CCD camera. A signal produced by photoelectric conversion of the light is supplied to the computer 150 through a communication system 133. Then, image processing is performed, whereby high precision position detection is accomplished.

The position detecting system shown in FIG. 7 is provided with a focus detection system AFS for detecting the focus position of the mark 8.

The oblique incidence light emitted from the light source 4 relatively shifts by $\tan\theta \times \Delta Z$ as the height of the alignment mark 8 changes by $\Delta Z$.

In order to obtain high precision resist shape information, first of all, accurate focusing is necessary. The principle of focus detection may be based on a slit light oblique projection method which is well known in the art, and an example disclosed in Japanese Laid-Open Patent Application, Laid-Open No. 112726/1989 may be used.

In accordance with this method, an irradiation slit 6 is once imaged upon the alignment mark 8 and, subsequently, it is enlarged at a predetermined magnification by lenses 9 and 24. After this, it is compressed by a cylindrical lens 20 in a one-dimensional direction and is re-imaged upon a sensor 21, constituting a CCD camera, as a light spot. When in FIG. 7 the position of the wafer 3 displaces upwardly or downwardly, the position of the light spot upon the sensor 21 shifts rightwardly or leftwardly. The level of the wafer 3 can be positioned with a 0.1 micron order, by detecting the position of the light spot on the sensor 21.

There may be cases wherein, during focus position detection, the reference light RL used for measurement of the resist shape becomes unnecessary. In such cases, a shutter 155 may be used to block the reference light RL to prevent it from being directed to the sensor 21.

In accordance with the arrangement described hereinbefore, high precision alignment without being influenced by asymmetry of a resist coating can be accomplished, and the primary object of the present embodiment can be achieved.

Next, the manner of positioning the illumination light and the alighment mark will be explained.

In FIG. 7, it is necessary that the relation between positions as illuminated by the light source 4 and the light source 141 is predetected. In this connection, what has been described with reference to FIG. 6 applies similarly.

In FIG. 6, regarding the range of illumination with illumination light having a wavefront of a desired phase difference, on the basis of information about the light p as reflected at a point P on the resist surface, the illumination light p' should illuminate the same location as the reflection point P on the resist surface. Without this, wavefront compensation is not attainable. This applies similarly to all the other light rays, including light rays q and q'. For this reason, in order to detect this relation, a silicon-etched special wafer Si is used.

Figure 8:
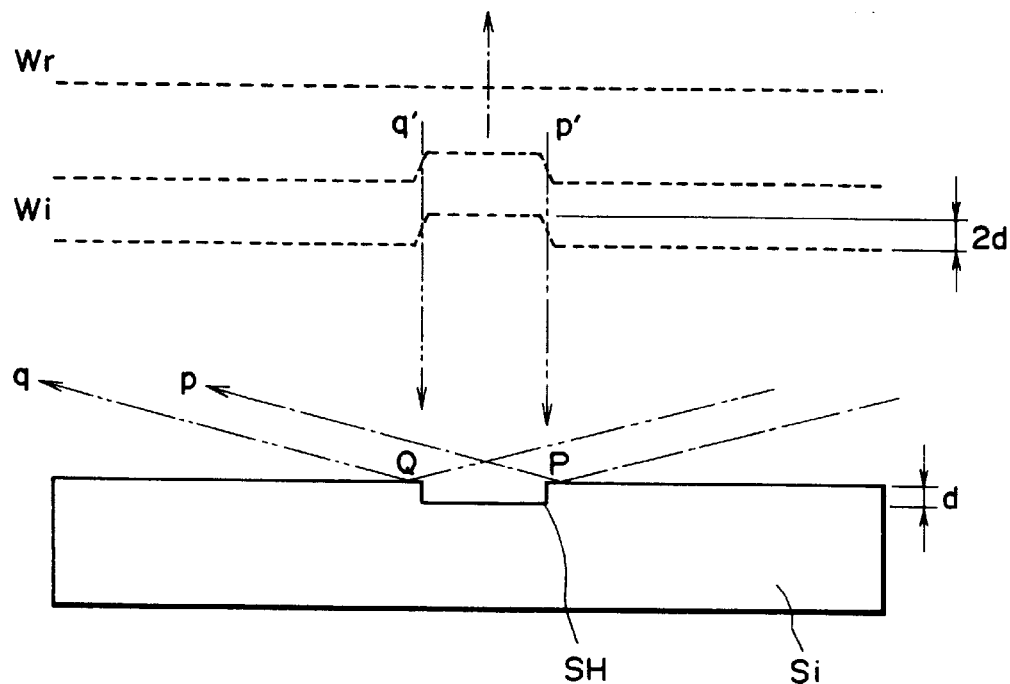
FIG. 8 is a schematic view for explaining the relation between illumination light and a mark, in the second embodiment of the present invention.
Figure 9:
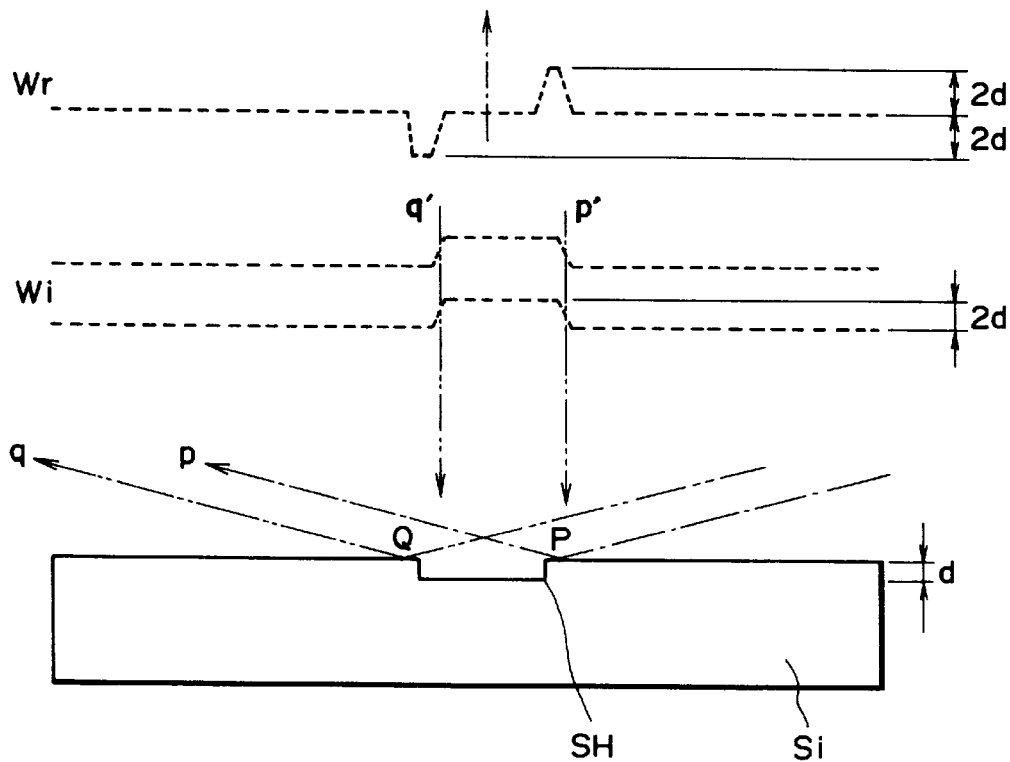
FIG. 9 is a schematic view for explaining the relation between illumination light and a mark, in another example of the second embodiment of the present invention.

FIG. 8 illustrates a case wherein the positioning of the illumination light and the alignment mark has been accomplished correctly. FIG. 9 illustrates a case wherein the adjustment is not yet accomplished.

In FIGS. 8 and 9, a pattern SH with a surface level difference d is first formed on a silicon-etched wafer Si.

With respect to this wafer Si, in accordance with the embodiment of FIG. 7, the surface shape is detected and then a wavefront having a phase difference corresponding to it is produced by which the illumination is performed.

The phase difference may be double to the normal (since the level difference is d, a phase difference of 2$d$ is applied). Further, in FIG. 7, the light refelcted by the polarization beam splitter 143 and not to be used for the alignment operation may be reflected by the polarization bean splitter 117, by opening the shutter 153, such that at the sensor 18 of the CCD camera, the light may be caused to interfere with the light from the wafer Si.

Before adjustment as in FIG. 9, a portion of the phase of reflection light from the wafer Si is delayed by 2$d$ while another portion is advanced by 2$d$. These two portions can be detected as interference fringe intensity upon the sensor 118 of the CCD camera.

In this case, the origin of the adaptive mirror ADM may be changed to produce a wavefront of a desired phase difference, and a corresponding interference fringe may be measured. By doing so, the reflected wavefront comprises a plane wave Wr as shown in FIG. 8, and the interference fringe intensity on the sensor 118 of the CCD camera becomes one color. Thus, the adjustment is accomplished correctly.

For directing light from the light source so that illumination light having a phase as produced by the adaptive mirror ADM is projected onto the wafer 3, use of mirrors or lens systems is necessary. These optical elements should be structured to meet the wavefront at the adaptive mirror ADM and the wafer 3.

However, since the phase is defined through the adaptive mirrow ADM, if, for example, the imaging by an even-number of times has to be changed to odd-number times imaging, it can be met by inverting the two-dimensional coordinate system on the adaptive mirror ADM. As regards changing the number of mirror surfaces, similarly, the coordinate system on the adaptive mirror ADM amy be inverted only with respect to the direction of the axis to be inverted.

Next, an ambodiment of a semiconductor device manufacturing method which uses a position detecting system and a projection exposure apparatus, such as described above, will be explained.

Figure 10:
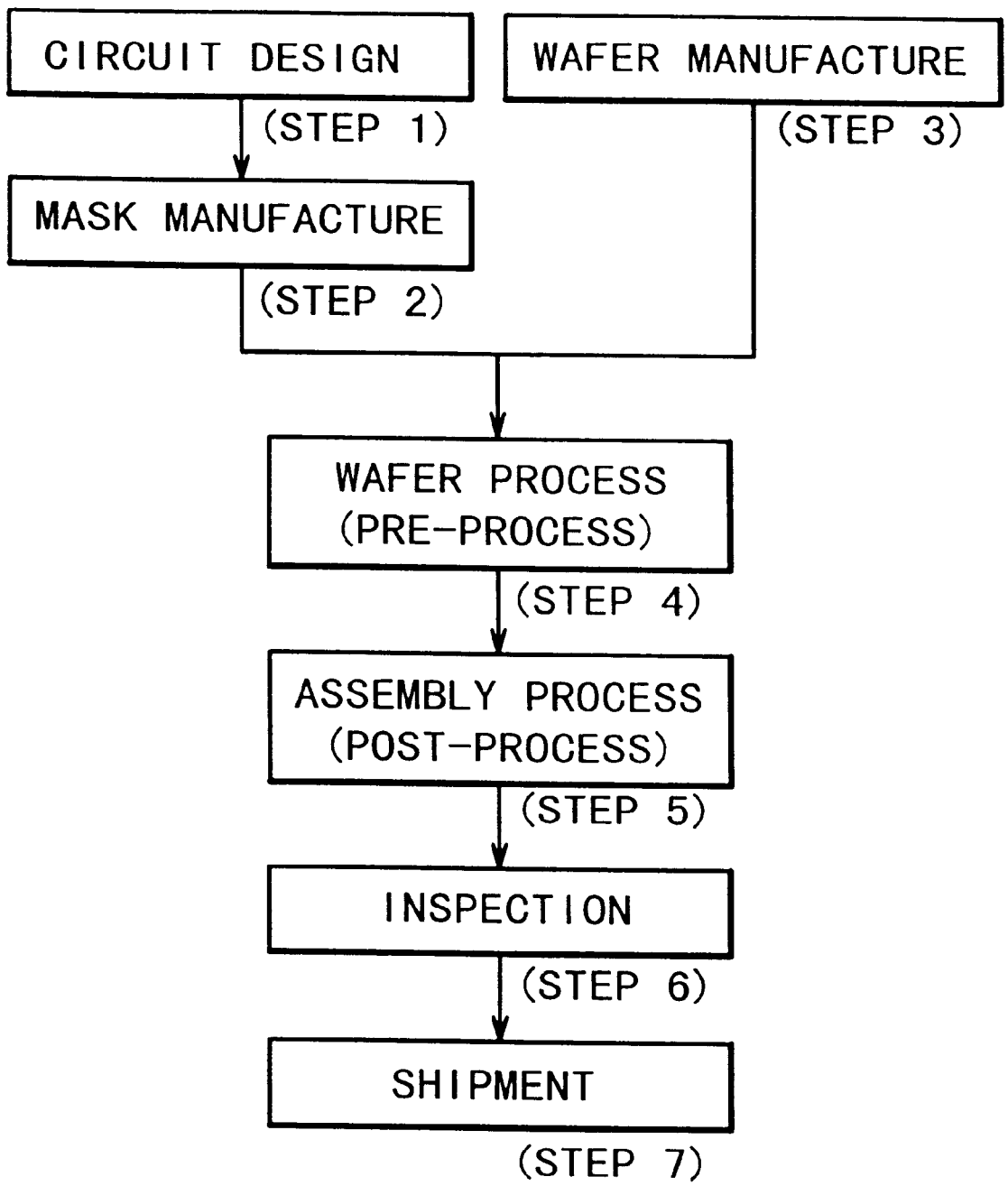
FIG. 10 is a flow chart of device manufacturing processes, according to an embodiment of the present invention.

FIG. 10 is a flow chart of a procedure for the manufacture of microdevices such as semiconductor chips (e.g., ICs or LSIs). liquid crystal panels, or CCDs, for example.

Step 1 is a design process for designing a circuit of a semiconductor device. Step 2 is a process for making a mask on the basis of the circuit pattern design. Step 3 is a process for preparing a wafer by using material such as silicon. Step 4 is a wafer process which is called a pre-process wherein, by using the so prepared mask and wafer, circuits are practically formed on the wafer through lithography. Step 5 subsequnet to this is an assembling step which is called a post-process wherein the wafer having been processed by step 4 is formed into semiconductor chips. This step includes an asembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 11:
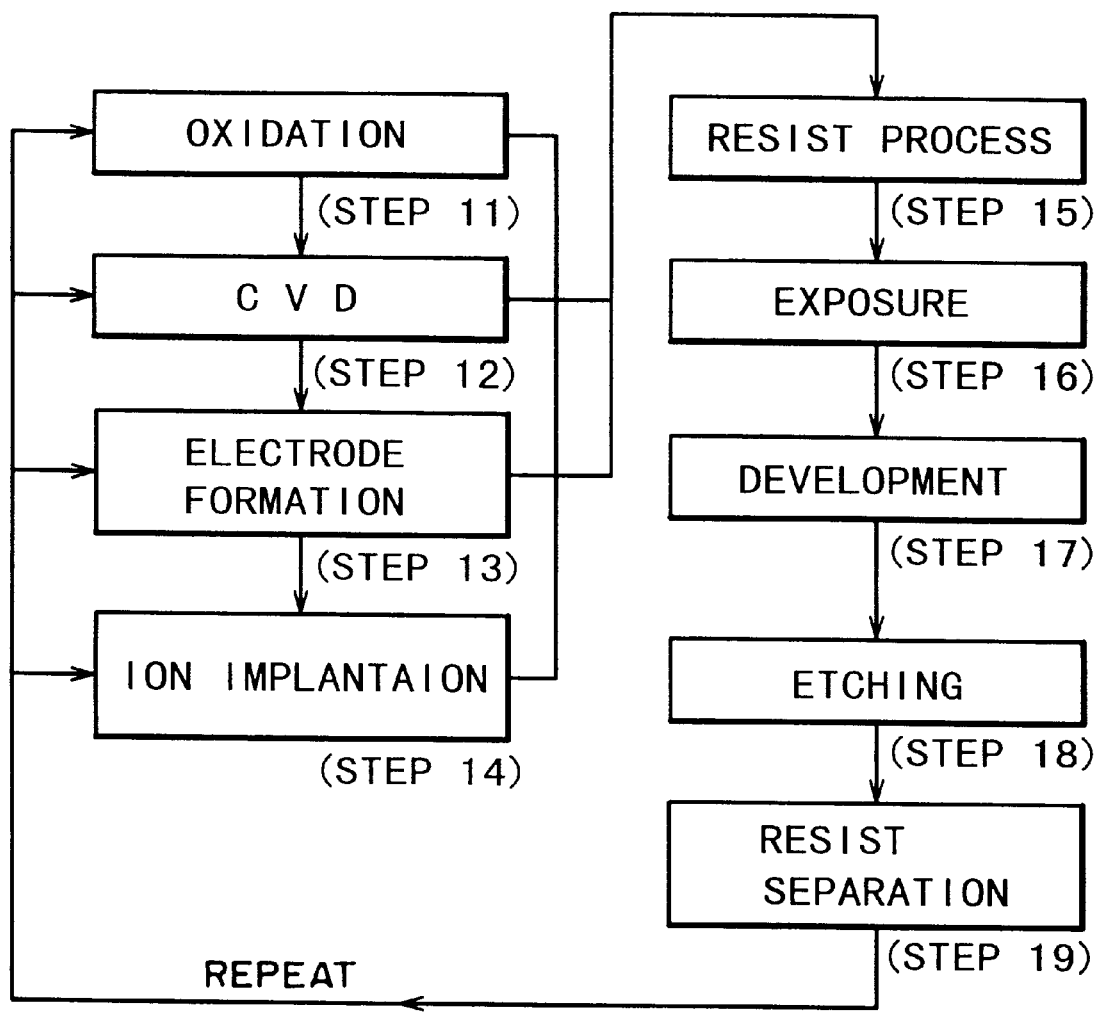
FIG. 11 is a flow chart of a wafer process, in an embodiment of the present invention.

FIG. 11 is a flow chart showing details of the wafer process. Step 11 is an oxidation process for oxidizing the surface of a wafer. Step 12 is a CVD process for forming an insulating film on the water surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the foregoing description has been made to some preferred embodiments, the applicability of the present invention is not limited to a semiconductor manufacturing apparatus. The invention is applicable, for example, also to a method or system for observing a microstructure as covered by a thin translucent film or for positioning such a microstructure. Further, various modifications may be made with use of what is known in the art.

In a semiconductor exposure apparatus having a position detecting system according to any one of the described embodiments, light obliquely projected on a mark to be detected is turned back to the mark, by which the refraction effect at the surface of a resist during obervation can be avoided. As a result, a process error attributable to asymmetry of the resist or an alighment pattern can be reduced, and high precision alignment and improved yield can be accomplished.

Further, a wavefront effective to cancel the refraction effect of a resist and to provide a plane wave after being incident on the resist, is produced, and the alighment mark is re-illuminated with the thus formed wavefront. This effectively reduces the refraction effect at the resist interface, and thus reduces the process error included in the slignment precision. Therefore, high precision alignment can be accomplished.

While the invention has been described with reference to the structures disclosed herein, it is not confined to the details set forth and this application is intended to cover such midifications or changes as may come within the purposes of the improvements or the scope of the following claims.

What is claimed is:

1. A position detecting method, comprising the steps of:
producing a wavefront that provides an optical path length distribution opposite to an optical path length distribution to be defined in accordance with a shape of a light transmissive film on a mark provided on an object to be inspected;
illuminating the mark with the produced wavefront; and
taking an image of the illuminated mark, wherein positional information related to the mark is produced in response to the image taking.

2. A method according to claim 1, wherein the production of the wavefront is made by use of reflection light resulting from obliquely illuminating the mark with a plane wave.

3. A method according to claim 1, wherein the production of the wavefront is made by use of an adaptive mirror.

4. A method according to claim 3, wherein the adaptive mirror has reflective poritions which can be actuated from the back, independently, by use of a number of piezoelectric devices.

5. A position detecting system, comprising:
a wavefront producing system for producing a wavefront that provides an optical path length distribution opposite to an optical path length distribution to be defined in acordance with a shape of a light transmissive film on a mark provided on an object to be inspected;
an illumination optical system for illuminating the mark with the produced wavefront; and
an image pickup device for taking an image of the illuminated mark, wherein positional information related to the mark is produced in response to the image taking.

6. A position detecting system according to claim 5, further comprising an optical system for directing reflection light resulting from obliquely illuminating the mark with a plane wave, to the mark.

7. A position detecting system according to claim 5, wherein said wavefront producing system includes an adaptive mirror.

8. A position detecting system according to claim 7, wherein said adaptive mirror has reflective portions which can be actuated from the back, independently, by use of a number of piezoelectric devices.

9. A projection exposure apparatus, comprising:
   a projection optical system for projecting a pattern of a reticle onto a wafer;
   a wavefront producing system for prodducing a wavefront that provides an optical path length distribution to be defined in accordance with a shape of a resist on a mark provided on the wafer;
   an illumination optical system for illuminating the mark with the produced wavefront;
   an image pickup device for taking an image of the illuminated mark; and
   an alignment system for aligning the wafer with respect to the reticle on the basis of the image taking through said image pickup device.

10. A device manufacturing method, comprising the steps of:
    producing a wavefront that provides an optical path length distribution opposite to an optical path length distribution to be defined in accordance with a shape of a resist on a mark provided on a wafer;
    illuminating the mark with the produced wavefront;
    taking an image of the illuminated mark;
    aligning the wafer with respect to a reticle on the basis of the image taking;
    printing, through projection exposure, a pattern of the reticle to the wafer having been aligned with respect to the reticle; and
    developing the resist of the projection-exposed wafer, whereby devices are produced from the developed wafer.

11. A position detecting method, comprising the steps of:
    illuminating a mark formed on an object to be inspected, along an oblique direction;
    re-illuminating the mark along a perpendicular direction, by use of reflection light from the obliquely illuminated mark; and
    taking an image of the re-illuminated mark, wherein positional information related to the mark is produced in response to the image taking.

12. A method according to claim 11, wherein, when an incidence angle of illumination light for the oblique illumination is $\theta$ and a refractive index of a light transmissive film formed on the mark is Nr, a relation $2\cos\theta = Nr-1$ is satisfied, and wherein an optical system for re-illuminating the mark along the perpendicular direction by use of the reflection light from the mark has an imaging magnification of $1/\cos\theta$.

13. A method according to claim 11, wherein an optical system for re-illuminating the mark along the perpendicular direction by use of the reflection light from the mark includes one or more mirrors and one or more lens groups, constituting one imaging system, and wherein the total number of mirrors and lens groups is an odd number.

14. A position detecting system, comprising:
    a first illumination system for illuminating a mark formed on an object to be inspected, along an oblique direction;
    a second illumination system for re-illuminating the mark along a perpendicular direction, by use of reflection light from the obliquely illuminated mark; and
    an image pcikup device for taking an image of the re-illuminated mark, wherein postional information related to the mark is produced in response to the image taking.

15. A position detecting system according to claim 14, wherein said first illumination system is arranged so that, when an incidence angle of illumination light is $\theta$ and a refractive index of a light transmissive film formed on the mark is Nr, a relation $2\cos\theta = Nr-1$ is satisfied, and wherein said second illumination system is arranged so that an imaging magnification for re-illuminating the mark along the perpendicular direction by use of the reflection light from the mark satisfied $1/\cos\theta$.

16. A position detecting system according to claim 14, further comprising a filter inserting mechanism disposed at a pupil position defined between the mark and said image pickup device.

17. A position detecting system according to claim 16, wherein said filter inserting mechanism includes a first filter for selecting and transmitting diffractive ight produced when the mark is illuminated obliquely, and a second filter for selecting and transmitting diffractive light produced when the mark is re-illuminated perpendicularly.

18. A position detecting system according to claim 14, further comprising means for optically detecting the position of the object with respect to the perpendicular direction, wherein said means has a light path which is partially in common to the light path of said second illumination system.

19. A position detecting system according to claim 14, wherein said second illumination system includes one or more mirrors and one or more lens groups, constituting one imaging system, and wherein the total number of mirrors and lens groups is an odd number.

20. A projection exposure apparatus, comprising:
    a projection optical system for projecting a pattern of a reticle onto a wafer;
    a first illuminating system for illuminating a mark formed on the wafer, along an oblique direction;
    a second illumination system for re-illuminating the mark along a perpendicular direction, by use of reflection light from the obliquely illuminated mark;
    an image pickup device for taking an image of the re-illuminated mark; and
    an alignment system for aligning the wafer with respect to the reticle on the basis of the image takiing through said image pickup device.

21. A device manufacturing method, comprising the steps of:
    illuminating a mark formed on a wafer along an oblique direction;
    re-illuminating the mark along a perpendicular direction, by use of reflection light from the obliquely illuminated mark;
    taking an image of the re-illuminated mark;
    aligning the wafer with respect to a reticle on the basis of the image taking;
    printing, through projection exposure, a pattern of the reticle onto the wafer having been aligned with respect to the reticle; and
    developing a resist of the exposed wafer, wherein devices can be produced from the developed wafer.

22. A position detecting method, comprising the steps of:

detecting information related to a shape of a light transmissive film on a mark formed on an object to be inspected;

producing a wavefront on the basis of the shape information, wherein the wavefront is produced so that a plane wave is provided after it is transmitted through the light transmissive film;

illuminating the mark with the produced wavefront; and taking an image of the illuminated mark, wherein positional information related to the mark is produced in response to the image taking.

23. A position detecting system, comprising:

a wavefront producing system for detecting information related to a shape of a light transmissive film on a mark formed on an object to be inspected, and for producing a wavefront on the basis of the shape information, wherein the wavefront is produced so that a plane wave is provided after it is transmitted through the light transmissive film;

an illumination optical system for illuminating the mark with the produced wavefront; and an image pickup device for taking an image of the illuminated mark, wherein positional information related to the mark is produced in response to the image taking.

24. A projection exposure apparatus, comprising:

a projection optical system for projecting a pattern of a reticle onto a wafer;

a wavefront producing system for detecting information related to a shape of a resist on a mark formed on the wafer, and for producing a wavefront on the basis of the shape information, wherein the wavefront is produced so that a plane wave is provided after it is transmitted through the resist;

an illumination optical system for illuminating the mark with the produced wavefront;

an image pickup device for taking an image of the illuminated mark; and an alignment system for aligning the wafer with respect to the reticle, on the basis of the image taking through said image pickup device.

25. A device manufacturing method, comprising the steps of:

detecting information related to a shape of a resist on a mark formed on a wafer;

producing a wavefront on the basis of the shape information, wherein the wavefront is produced so that a plane wave is provided after it is transmitted through the resist;

illuminating the mark with the produced wavefront;

taking an image of the illuminated mark;

aligning the wafer with respect to the reticle, on the basis of the image taking;

printing, through projection exposure, a pattern of the reticle onto the wafer having been aligned with respect to the reticle; and developing the resist of the exposed wafer, wherein devices can be produced from the developed wafer.

\* \* \* \* \*

UNITED STATES PATENT AND TRADEMARK OFFICE
CERTIFICATE OF CORRECTION

PATENT NO. : 6,266,130 B1
DATED : July 24, 2001
INVENTOR(S) : Masanobu Hasegawa et al.

It is certified that error appears in the above-identified patent and that said Letters Patent is hereby corrected as shown below:

Title page,
ABSTRACT, line 4, "pat" should read -- path --.

Drawings,
Figure 11, "ION IMPLANTAION" should read -- ION IMPLANTATION --.

Column 1,
Line 21, "This" should read -- this --;
Line 42, "after" should read -- wafer --; and
Line 60, "in" should be deleted.

Column 4,
Line 10, "bight-field" should read -- bright-field --.

Column 11,
Line 19, "mirrow" should read -- mirror --;
Line 24, "amy" should read -- may --;
Line 41, "subsequnet" should read -- subsequent --;
Line 44, "asembling" should read -- assembling --;
Line 53, "water" should read an -- wafer --;
Line 59, "applying a resist" should be deleted.
Line 60, "(photosensitive material) to the wafer. Step 16 is an exposure" should be deleted; and
Line 61, "process for" should be deleted.

Column 12,
Line 17, "alighment" should read -- alignment --;
Line 22, "alighment" should read -- alignment --;
Line 25, "slignment" should read -- alignment --; and
Line 31, "midifications" should read -- modifications --.

UNITED STATES PATENT AND TRADEMARK OFFICE
CERTIFICATE OF CORRECTION

PATENT NO. : 6,266,130 B1
DATED : July 24, 2001
INVENTOR(S) : Masanobu Hasegawa et al.

It is certified that error appears in the above-identified patent and that said Letters Patent is hereby corrected as shown below:

<u>Column 14,</u>
Line 4, "pcikup" should read -- pickup --;
Line 16, "satisfied" should read -- satisfies --;
Line 23, "ight" should read -- light --;
Line 41, "illuminating" should read -- illumination --;
Line 49, "takiing" should read -- taking --; and
Line 54, "wafer" should read -- wafer, --.

Signed and Sealed this

Twenty-eighth Day of May, 2002

Attest:

Attesting Officer

JAMES E. ROGAN
Director of the United States Patent and Trademark Office